(12) United States Patent
Maciejewski et al.

(10) Patent No.: US 8,912,626 B2
(45) Date of Patent: Dec. 16, 2014

(54) EFUSE AND METHOD OF FABRICATION

(75) Inventors: Edward P. Maciejewski, Hopewell Junction, NY (US); Dustin Kenneth Slisher, Hopewell Junction, NY (US); Stefan Zollner, Las Cruces, NM (US)

(73) Assignee: International Business Machines Corporation, Armonk, NY (US)

( * ) Notice: Subject to any disclaimer, the term of this patent is extended or adjusted under 35 U.S.C. 154(b) by 875 days.

(21) Appl. No.: 13/013,055

(22) Filed: Jan. 25, 2011

(65) Prior Publication Data
US 2012/0187529 A1 Jul. 26, 2012

(51) Int. Cl.
*H01L 23/525* (2006.01)

(52) U.S. Cl.
CPC .................................. *H01L 23/5256* (2013.01)
USPC .......................................................... 257/529

(58) Field of Classification Search
CPC ............ H01L 23/5252; H01L 23/5254; H01L 23/5256; H01L 23/5258; H01L 28/75
USPC ................... 257/209, 529, E23.147, E23.149
See application file for complete search history.

(56) References Cited

U.S. PATENT DOCUMENTS

| | | |
|---|---|---|
| 6,191,000 B1 | 2/2001 | Huang et al. |
| 6,570,238 B2 * | 5/2003 | Hui et al. .................... 257/529 |
| 6,756,255 B1 | 6/2004 | Thuruthiyil et al. |
| 7,381,594 B2 | 6/2008 | Hsu et al. |
| 7,645,645 B2 | 1/2010 | Hovis et al. |
| 7,656,005 B2 | 2/2010 | Booth, Jr. et al. |
| 2001/0015472 A1 | 8/2001 | Fukuzumi et al. |
| 2001/0024868 A1 * | 9/2001 | Nagel et al. ................ 438/496 |
| 2004/0219720 A1 * | 11/2004 | Jeng et al. ................... 438/131 |
| 2007/0207579 A1 | 9/2007 | Omura |
| 2008/0237786 A1 | 10/2008 | Yang et al. |
| 2010/0072571 A1 * | 3/2010 | Min ............................. 257/529 |
| 2010/0078727 A1 | 4/2010 | Min et al. |

* cited by examiner

*Primary Examiner* — Ha Tran T Nguyen
*Assistant Examiner* — Raj R Gupta
(74) *Attorney, Agent, or Firm* — Yuanmin Cai; Keivan Razavi

(57) ABSTRACT

An improved eFuse and method of fabrication is disclosed. A cavity is formed in a substrate, which results in a polysilicon line having an increased depth in the area of the fuse, while having a reduced depth in areas outside of the fuse. The increased depth reduces the chance of the polysilicon line entering the fully silicided state. The cavity may be formed with a wet or dry etch.

11 Claims, 5 Drawing Sheets

EFUSE AND METHOD OF FABRICATION

FIELD OF THE INVENTION

The present invention relates to semiconductor integrated fabrication, and more specifically to electrically programmable fuses (eFuses).

BACKGROUND OF THE INVENTION

Electrically programmable fuses (eFuses) used in re-routing circuits often include poly-silicon strips with a thin layer of silicide covering the top of the strips. eFuses, have become very popular recently, because of the circuit and systems design flexibility that it provides; the eFuse can be programmed even when the chip is mounted in the package and installed in the system. For example, customers can tailor a design to the specific needs of the application after the product is installed in the field. The eFuse also enables the freedom to alter the design, or fix any problem that may occur during the life of the product.

Passing current through the eFuse results in the electromigration of silicide material in the eFuse. Electromigration refers to the transport of material caused by the gradual movement of the ions in a conductor due to the momentum transfer between conducting electrons and diffusing metal atoms. As the trend of miniaturization in semiconductors continues, the reliability of prior art eFuses may suffer. Therefore, it is desirable to have an improved eFuse that offers reliable operation as the technology size continues to decrease.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs.) of the drawing, in which case typically the last two significant digits may be the same, the most significant digit being the number of the drawing figure (FIG).

FIG. 1 is a side view of a prior art eFuse.

FIG. 2 is a top-down view of a prior art eFuse.

FIG. 3A is a side view of an intermediate step in fabricating an eFuse in accordance with an embodiment of the present invention.

FIG. 3B is a side view of an eFuse in accordance with an embodiment of the present invention.

FIG. 4 is a top-down view of an eFuse in accordance with an embodiment of the present invention.

FIG. 5 is a top-down view of an eFuse in accordance with an additional embodiment of the present invention.

FIG. 6 is a flowchart indicating process steps for performing a method of fabricating an eFuse.

FIG. 7 shows a block diagram of an exemplary design flow.

SUMMARY

In one embodiment of the present invention, an electronically programmable fuse (eFuse) is provided. The eFuse comprises a dielectric region, and a polysilicon line disposed on the dielectric region. A silicide layer is formed on the polysilicon line. A first contact is disposed at a first location on the polysilicon line and a second contact disposed at a second location on the polysilicon line. The polysilicon line comprises a fuse region and two outside regions, and the two outside regions are adjacent to the fuse region. The polysilicon line has a first depth in the outside regions and a second depth in the fuse region. The second depth is greater than the first depth.

In another embodiment of the present invention, a method of fabricating an electronically programmable fuse (eFuse) is provided. The method comprises forming a cavity in a shallow trench isolation region, then forming a polysilicon line on the shallow trench isolation region, including over the cavity. The polysilicon line is planarized, such that the polysilicon line is deeper in the portion of the polysilicon line that is over the cavity. Silicide is formed on the polysilicon line, and then a first and second contact is disposed on the polysilicon line.

DETAILED DESCRIPTION

Figure 1:
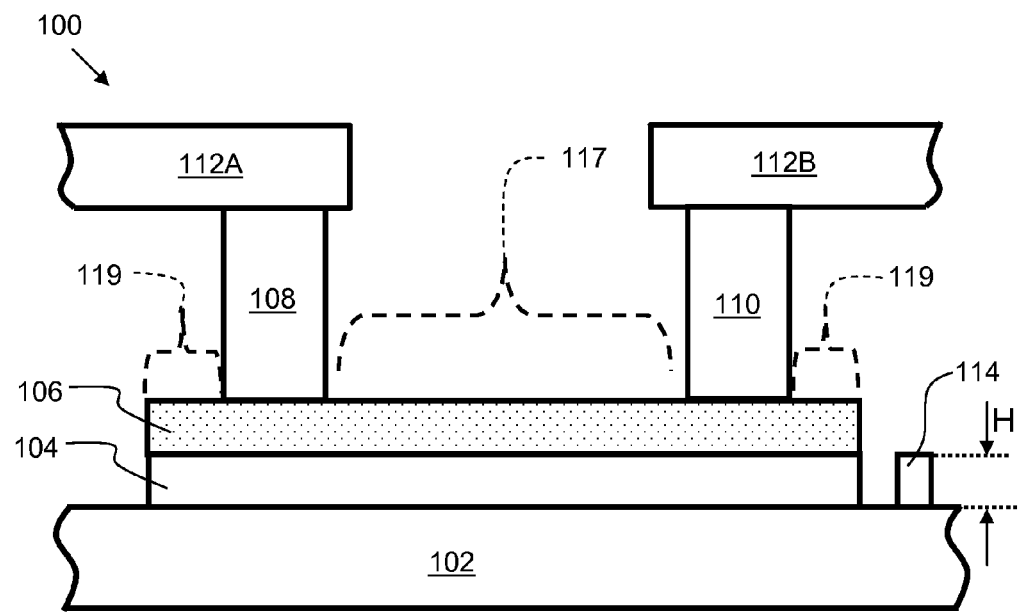

FIG. 1 is a side view of a prior art eFuse 100. eFuse 100 is formed on a dielectric layer 102. A polysilicon line 104 is formed on the dielectric layer. A silicide layer 106 is formed on the polysilicon line 104. Metal contacts 108 and 110 form the two contacts of the eFuse 100. Metal region 112A is electrically connected to contact 108, and metal region 112B is electrically connected to contact 110. Metal regions 112A and 112B are part of the same metal layer. When the eFuse is intact, an electrical connection exists between metal region 112A and metal region 112B. When the eFuse is in an open state (e.g. "blown"), there is an electrical open between metal region 112A and metal region 112B. Note that the term "blown" regarding the eFuse implies that an open is created, severing the electrical connection between contact 108 and contact 110. The eFuse is "blown" by applying a current which causes electromigration of the silicide to one side of the eFuse, creating the open circuit. The polysilicon line 104 is of the same height H as polysilicon used for gate electrode 114. This is because the same polysilicon deposition process used to create the gate electrode 114 is also used to create polysilicon line 104. The region between contact 108 and contact 110 is the fuse region 117. Outside regions 119 are disposed adjacent to the fuse region on each side. In eFuse 100, the depth of polysilicon line 104 is the same within the fuse region 117 as it on outside regions 119.

Figure 2:
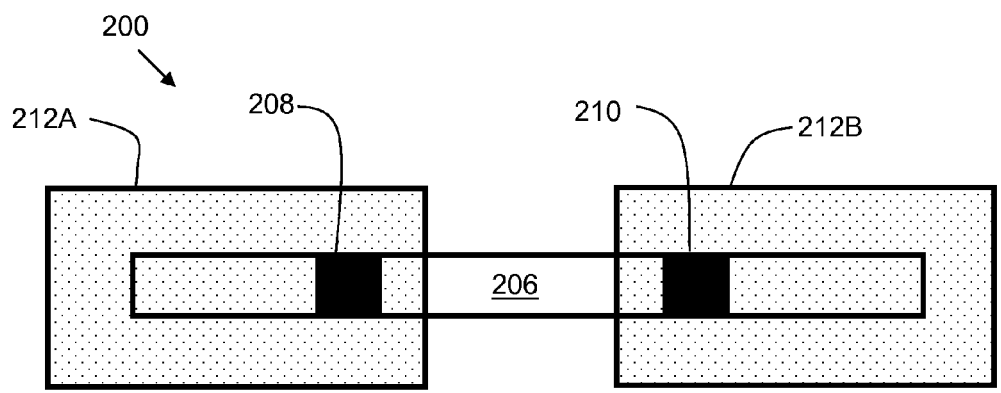

FIG. 2 is a top-down view of a prior art eFuse 200 which is similar to eFuse 100 of FIG. 1. Metal region 212A is electrically connected to metal region 212B via contact 208, silicide layer 206, and contact 210, while the eFuse 200 is in an intact state.

Figure 3A:

FIG. 3A is a side view of an intermediate step in fabricating an eFuse in accordance with an embodiment of the present invention. In this view, cavity 303 is formed within dielectric substrate 302. Substrate 302 may be a shallow trench isolation (STI) region of a semiconductor.

Figure 3B:
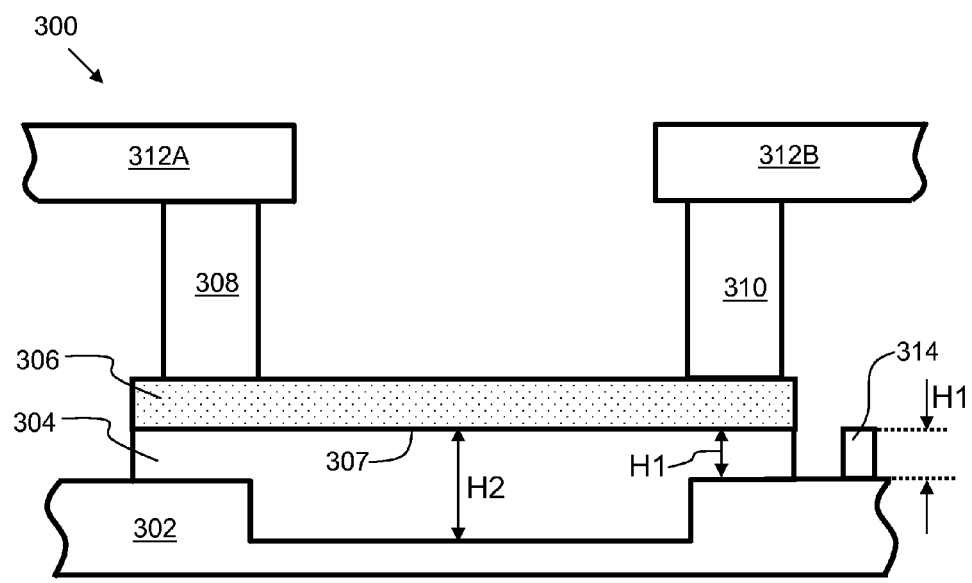

FIG. 3B is a side view of an eFuse 300 in accordance with an embodiment of the present invention. A main difference between eFuse 300 and eFuse 100 of FIG. 1 is that polysilicon line 304 of eFuse 300 is a multiple depth line. Polysilicon line is formed on substrate 302, including over the cavity (303 of FIG. 3A). In a region disposed between the contacts 308 and 310, the polysilicon line 304 is of a greater depth H2 than at the periphery of the fuse, near the contacts (308, 310) where the depth of the polysilicon line 304 is H1, which is the same depth as gate electrode 314. Depth H2 is greater than depth H1. In one embodiment, depth H1 is in the range of 200 angstroms to 400 angstroms, and depth H2 is in the range of 450 angstroms to 600 angstroms. The polysilicon line 304 is planarized such that the top surface 307 of polysilicon line 304 is at a consistent level in regions of depth H2 and depth H1. The planarizing of the polysilicon line 304 may be performed via a chemical mechanical polish (CMP) process. Silicide 306 is formed on polysilicon line 304. In one embodiment, silicide 306 has a thickness ranging from 80 angstroms to 190 angstroms.

As the semiconductor technology size continues to decrease, depth H1 also continues to decrease. However, the decreased depth of a polysilicon line can compromise the silicide. The decreased depth increases the probability that the polysilicon line will enter the fully-silicided (FUSI) state during the siliciding process. This may result in defective fuses that are not able to be put into a "blown" state. This is because some polysilicon underneath the silicide promotes the ability of the eFuse to be put into the blown state. By forming a cavity in substrate 302 prior to depositing polysilicon line 304, the polysilicon line is deeper in the area of the eFuse, the FUSI condition is avoided in the fuse region, while thinner polysilicon lines (having depth H1) are used elsewhere in the semiconductor circuit, providing the advantages such as device density in line with the decreased technology size. Therefore, embodiments of the present invention address a tradeoff of decreased technology size and eFuse reliability.

Figure 4:
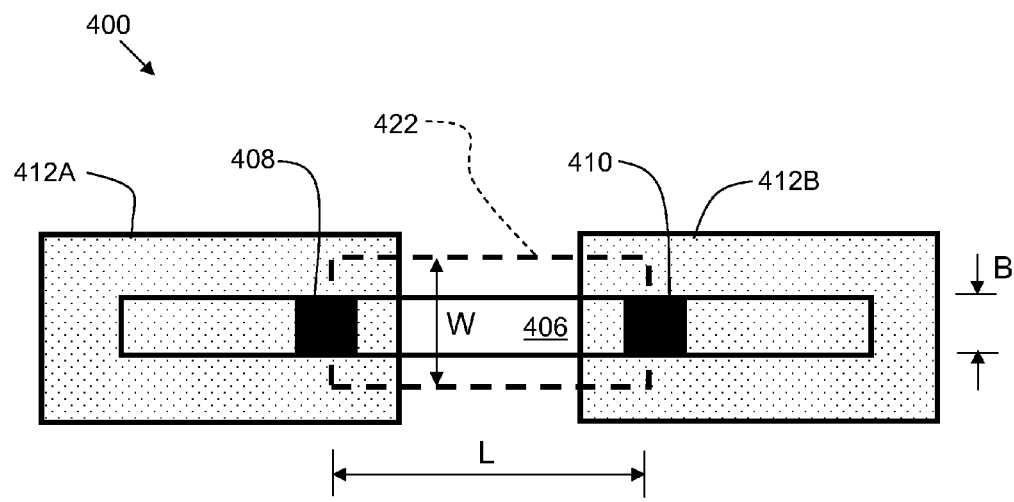

FIG. 4 is a top-down view of an eFuse 400 which is similar to eFuse 300 of FIG. 3. Metal region 412A is electrically connected to metal region 412B via contact 408, silicide layer 406, and contact 410, while the eFuse 400 is in an intact state. Cavity 422 is created in the underlying substrate (see 302 of FIG. 3) to allow a deeper polysilicon line for the fuse. Cavity 422 has width W and length L. Width W is preferably greater than width B, which represents the width of the silicide layer 406. In this embodiment, length L is such that cavity 422 extends partially under contact 408 and contact 410.

Figure 5:
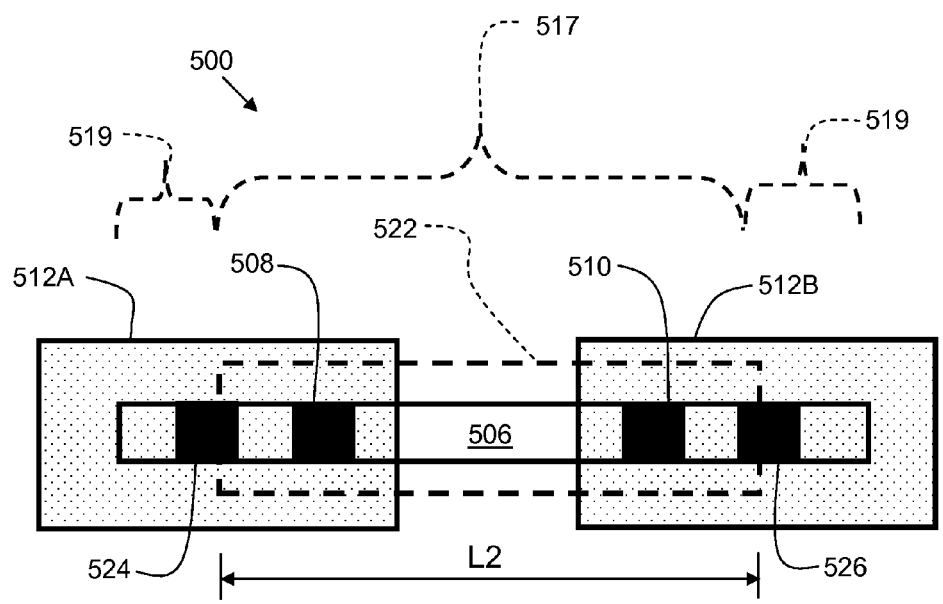

FIG. 5 is a top-down view of an eFuse 500 in accordance with an additional embodiment of the present invention. In this embodiment, there are additional contacts 524 and 526 on each side of the eFuse. In practice, multiple contacts may be used on each side of the eFuse for redundancy purposes. In this embodiment, cavity 522 has length L2 which causes cavity 522 to extend beyond contact 508 and contact 510. The length of cavity 522 can be optimized to provide optimal silicide conditions for a given eFuse. In this case, the fuse region 517 extends beyond the innermost contacts 508 and 510, and outside regions 519 partially include additional contacts 524 and 526.

Figure 6:
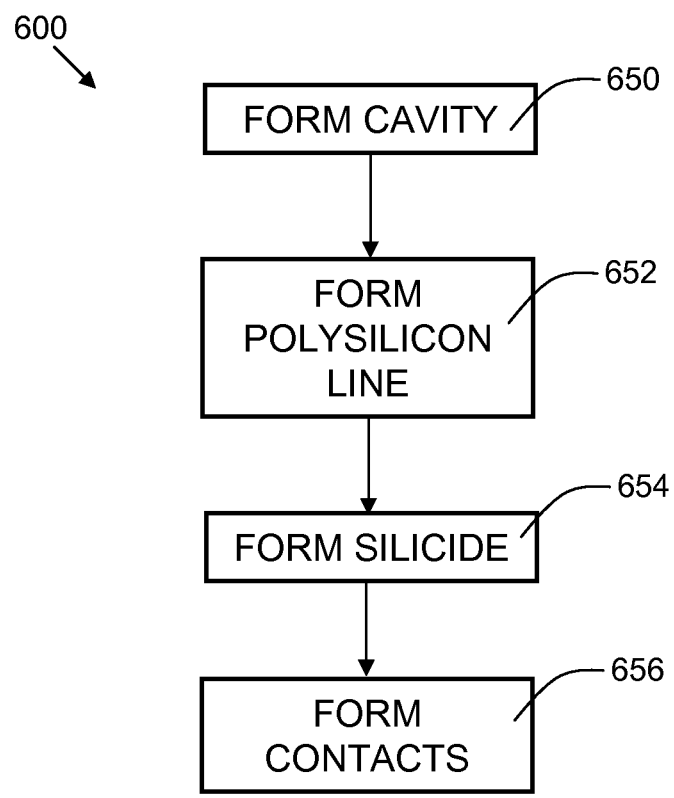

FIG. 6 is a flowchart 600 indicating process steps for performing a method of fabricating an eFuse. In process step 650, a cavity is formed in a substrate (see 422 of FIG. 4). This cavity may be formed by etching. The etch can be a dry etch, such as a reactive ion etch (RIE), or a wet etch, such as an HF (hydrofluoric acid) etch. In process step 652, a polysilicon line is formed. Due to the cavity formed in step 650, the polysilicon line that is formed in step 652 is deeper in the region between fuse contacts, which facilitates better silicide formation. In process step 654, a silicide layer is formed on the polysilicon line (see 306 of FIG. 3). The silicide is conductive, and forms the intact fuse. In one embodiment, the silicide comprises one of, cobalt silicide, nickel silicide, tungsten silicide, and copper silicide. Alternatively, any other metal capable of reacting with silicon/polysilicon to form a low resistivity thermally stable silicide may be used. In step 656, contacts are formed. At least one contact is formed on each side of the polysilicon line (see 308 and 310 of FIG. 3). In some embodiments, there may be more than one contact on each side of the polysilicon line, as shown in eFuse 500 of FIG. 5.

Figure 7:
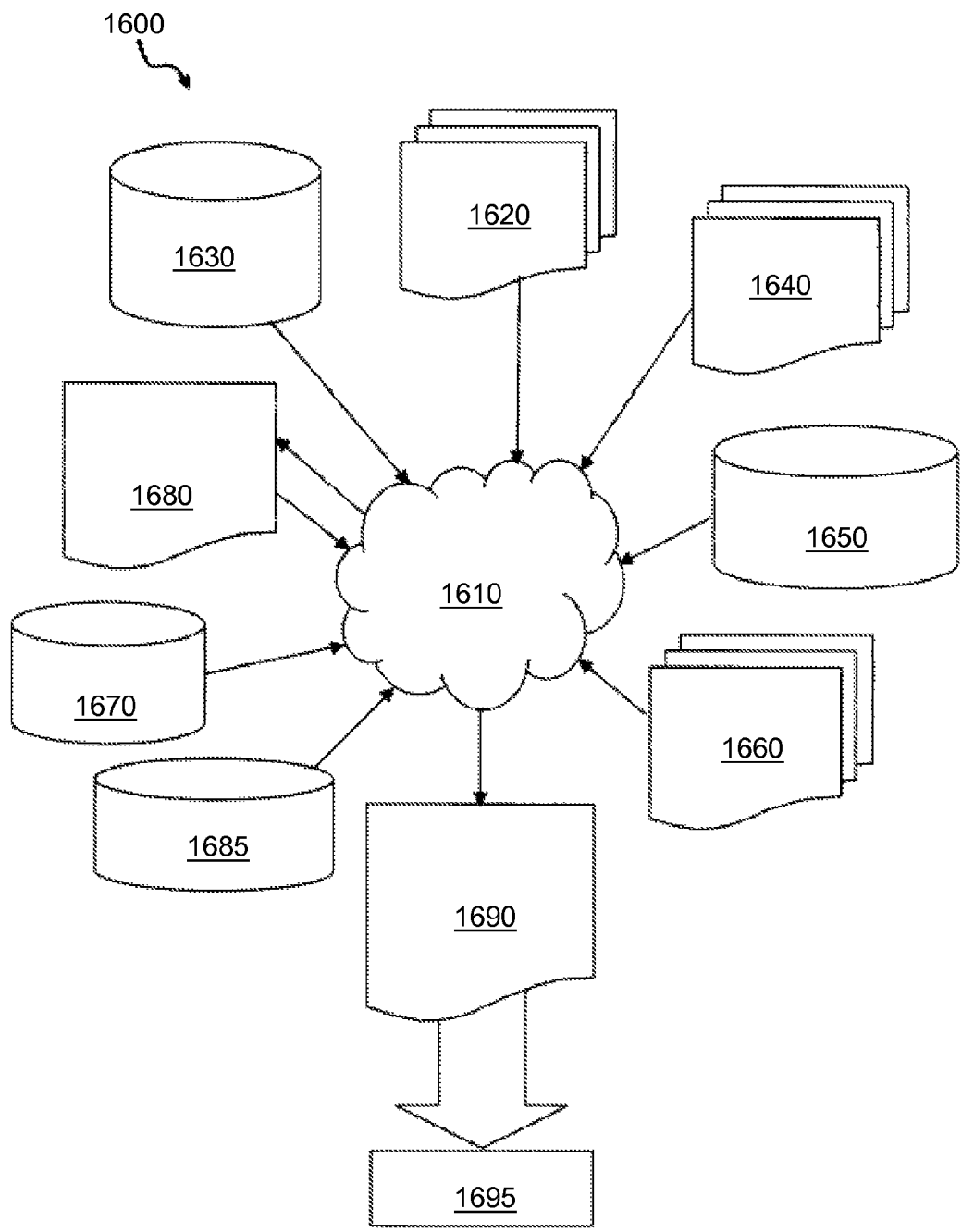

FIG. 7 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 3-5. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 3-5. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 3-5 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 3-5, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 3-5. Design structure 1690 may then proceed to a stage 1695 where, for example, design structure 1690: proceeds to tapeout, is released to manufacturing, is released to a mask house, is sent to another design house, and is sent back to the customer.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An electronically programmable fuse, comprising:
   a dielectric region;
   a polysilicon line disposed on the dielectric region;
   a silicide layer formed on the polysilicon line;
   a first contact disposed at a first location on the polysilicon line;
   a second contact disposed at a second location on the polysilicon line;
   wherein the polysilicon line comprises a fuse region, wherein the fuse region is disposed between the first contact and the second contact, and two outside regions, the two outside regions adjacent to the fuse region;
   wherein the polysilicon line has a first depth of a single thickness in the outside regions;
   wherein the polysilicon line has a second depth of a single thickness in the fuse region;
   wherein the polysilicon line has a planar top surface; and
   wherein the second depth is greater than the first depth.

2. The electronically programmable fuse of claim 1, wherein the silicide layer comprises cobalt silicide.

3. The electronically programmable fuse of claim 1, wherein the silicide layer comprises nickel silicide.

4. The electronically programmable fuse of claim 1, wherein the silicide layer comprises copper silicide.

5. The electronically programmable fuse of claim 1, wherein the silicide layer comprises tungsten silicide.

6. The electronically programmable fuse of claim 1, further comprising:
   a cavity formed within the dielectric region;
   wherein the polysilicon line disposed on the dielectric region and within the cavity; and
   wherein the width of the cavity is greater than the width of the polysilicon line.

7. The electronically programmable fuse of claim 6, wherein the cavity partially extends under the first and second contacts.

8. The electronically programmable fuse of claim 6, wherein the cavity extends beyond the first and second contacts.

9. The electronically programmable fuse of claim 1, wherein the first depth ranges from about 210 angstroms to about 390 angstroms.

10. The electronically programmable fuse of claim 9, wherein the second depth ranges from about 460 angstroms to about 590 angstroms.

11. An electronically programmable fuse, comprising:
    a shallow trench isolation region;
    a cavity formed within the shallow trench isolation region;
    a polysilicon line disposed on the shallow trench isolation region and within the cavity;
    a silicide layer formed on the polysilicon line;
    a first contact disposed at a first location on the polysilicon line;

a second contact disposed at a second location on the polysilicon line;
wherein the polysilicon line comprises a fuse region, wherein the fuse region is disposed between the first contact and the second contact, and two outside regions, the two outside regions adjacent to the fuse region;
wherein the cavity partially extends under the first and second contacts;
wherein the polysilicon line has a first depth of a single thickness in the outside regions;
wherein the polysilicon line has a second depth of a single thickness in the fuse region;
wherein the polysilicon line has a planar top surface;
wherein the second depth ranges from about 460 angstroms to about 590 angstroms; and
wherein the silicide layer has a thickness ranging from about 85 angstroms to about 185 angstroms.

* * * * *